US006709938B2

United States Patent
Miles et al.

(10) Patent No.: US 6,709,938 B2
(45) Date of Patent: Mar. 23, 2004

(54) SOURCE/DRAIN EXTENSION FABRICATION PROCESS WITH DIRECT IMPLANTATION

(75) Inventors: Donald S. Miles, Plano, TX (US); Douglas T. Grider, McKinney, TX (US); P. R. Chidambaram, Richardson, TX (US); Amitabh Jain, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/197,988

(22) Filed: Jul. 18, 2002

(65) Prior Publication Data

US 2003/0040169 A1 Feb. 27, 2003

Related U.S. Application Data

(60) Provisional application No. 60/313,504, filed on Aug. 21, 2001, and provisional application No. 60/350,007, filed on Jan. 23, 2002.

(51) Int. Cl.[7] .............................................. H01L 21/336
(52) U.S. Cl. ...................... 438/303; 438/230; 438/231; 438/232; 438/301; 438/305
(58) Field of Search .................................. 438/199, 197, 438/217, 230–232, 290, 301, 303, 305

(56) References Cited

U.S. PATENT DOCUMENTS 6,521,502 B1 * 2/2003 Yu .............................. 438/305

* cited by examiner

*Primary Examiner*—Richard Elms
*Assistant Examiner*—Beth E. Owens
(74) *Attorney, Agent, or Firm*—Wade James Brady III; Frederick J. Telecky, Jr.

(57) ABSTRACT

An improved source/drain extension process is provided by the following processing steps of implanting NMOS devices directly on either side of the gates without an oxide layer (step D2), covering the gates with a cap oxide layer(step E2), covering NMOS devices with photoresist(step F2), dry etching all PMOS devices (Step G2), and implanting PMOS devices (step I2).

10 Claims, 6 Drawing Sheets

SOURCE/DRAIN EXTENSION FABRICATION PROCESS WITH DIRECT IMPLANTATION

This application claims priority under 35 USC §119(e)(1) of provisional applications numbers 60/313,504 filed Aug. 21, 2001 and 60/350,007 filed Jan. 23, 2002.

FIELD OF THE INVENTION

This invention focuses on the improvement of source/drain extension fabrication process in Complementary Metal Oxide Semiconductor (CMOS) devices.

BACKGROUND OF THE INVENTION

Complementary Metal Oxide Semiconductor (CMOS) devices have found wide use in the electronics industry. These devices include both NMOS and PMOS transistors to form the logic elements. These devices have source/drain MDD (Medium Doped Drain) extension implants. These extension implants may also be High Doped Drain (HDD) implants. The devices may include on the same wafer both low voltage (LV) and high voltage (HV) MOS transistors. For example see Hutter et al. U.S. Pat. No. 5,472,887, incorporated herein by reference. More on fabrication according to the prior art is found in the text edited by S. M. Sze entitled "VLSI Technology Second Edition" published by Mc Graw Hill.

Referring to FIG. 1 there is illustrated the conventional CMOS source/drain MDD extension process. The gate electrode is defined by growing a thin silicon dioxide layer over the silicon base and then the deposition of a polysilicon film (2000 Angstroms for example) over the wafer. The wafer is then patterned and etched forming the gate electrode as represented by stage 101. The second stage 102 is a growth of a poly oxide film covering the entire wafer. The next step 103 is NMOS MDD implant of high voltage NMOS transistors (NMDD2+). The implant is annealed with heat diffusing the implant under the poly oxide in the silicon base. A photoresist is placed to protect the NMOS transistor areas leaving open the PMOS areas. This is represented by stage 104.

The next step is to implant the area that defines the core PMOS transistors. PMOS MDD implant is then performed as represented by stage 105 with the implant under the poly oxide grown in stage 102 on the silicon base on either side of the gate. The PMOS transistor regions are then covered with a photoresist to protect from the low voltage NMOS implant in stage 107. This is represented by stage 106. Stage 107 illustrates the low voltage NMOS MDD implant. After the NMOS MDD implant the wafer is annealed. as represented by stage 107. This is then covered with a photoresist as represented by stage 108.

SUMMARY OF THE INVENTION

In accordance with an embodiment of the present invention, a process for forming a CMOS source/drain extension includes implanting NMOS area directly on either side of the gates without an oxide layer then deposit cap oxide layer followed by dry etching PMOS device areas with a dry etch to remove cap oxide from the silicon base but leaving cap oxide on the side walls before implanting the PMOS device areas.

DESCRIPTION OF PREFERRED EMBODIMENTS OF THE PRESENT INVENTION

Figure 2:
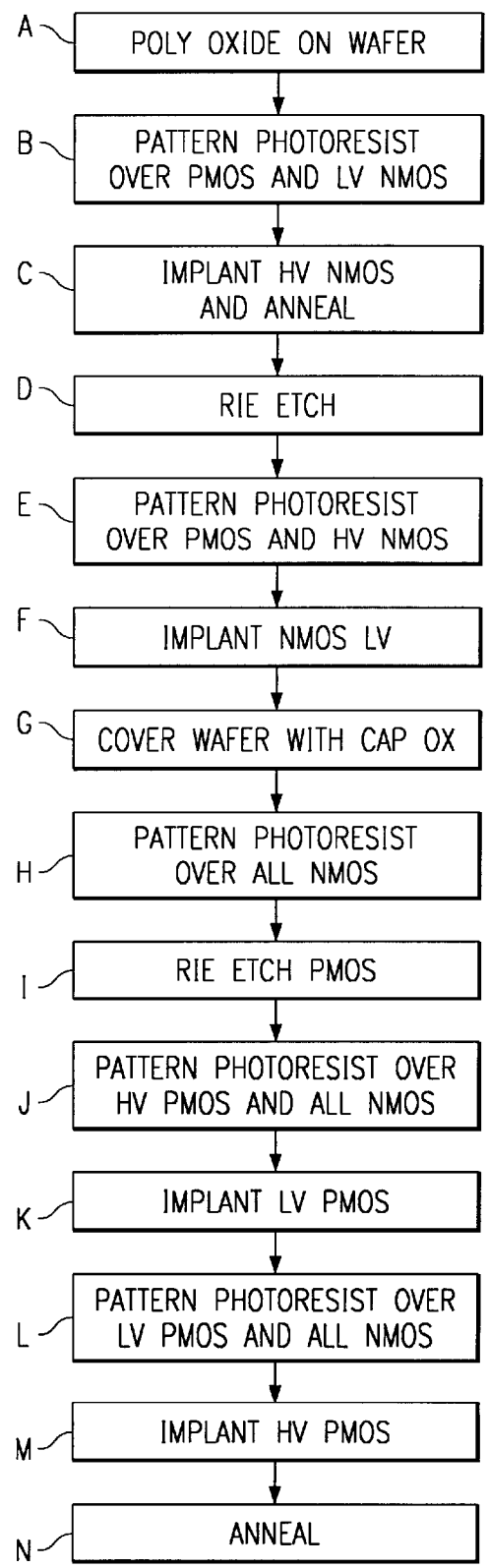
FIG. 2 illustrates a first alternative process according to one embodiment of the present invention.
Figure 3:
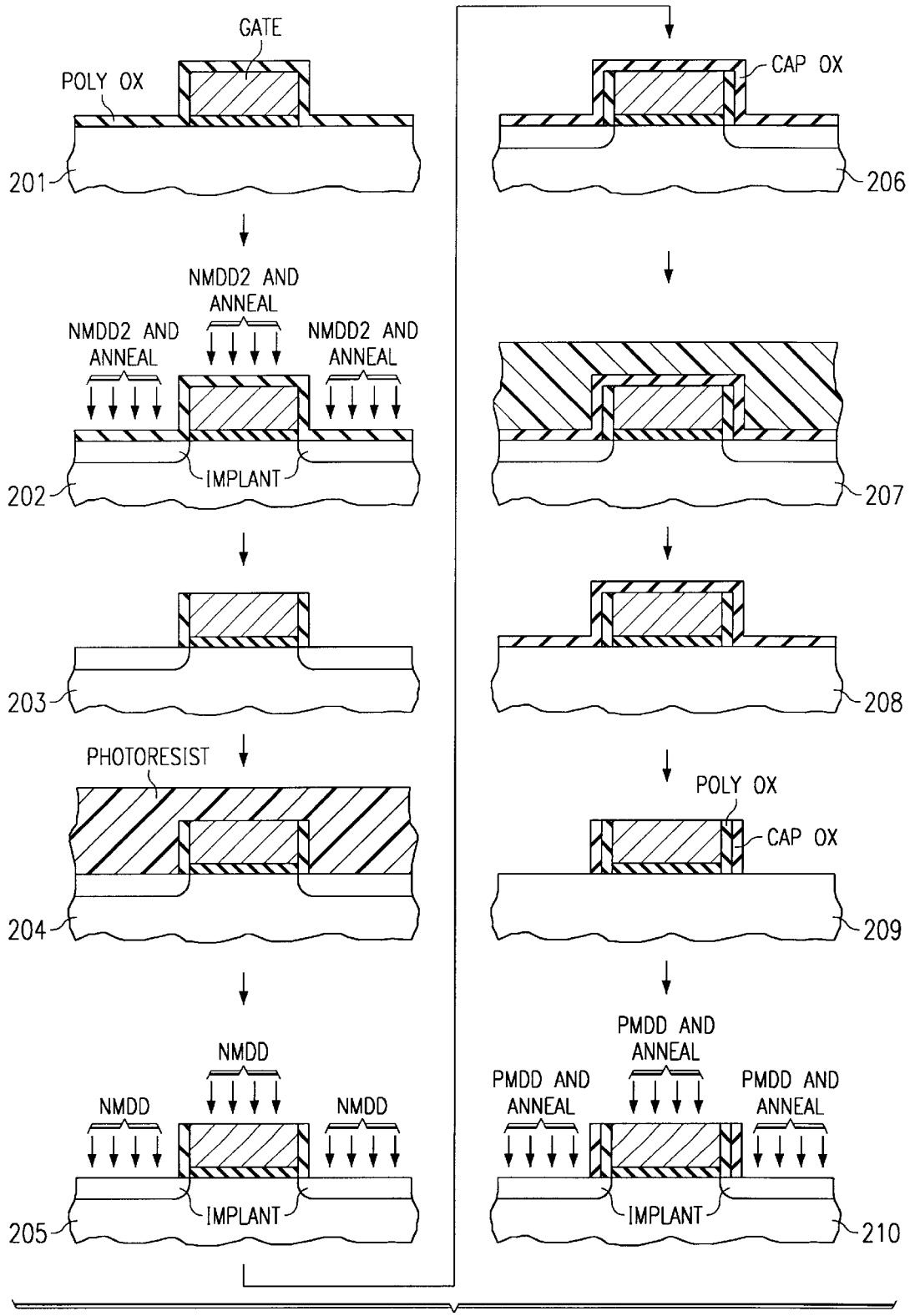
FIG. 3 illustrates stages associated with the steps in the first alternative process.

Applicants' invention is an improved alternative source/drain extension processes. Referring to FIG. 2, there is illustrated the steps according to a first embodiment of the present invention. FIG. 3 illustrates stages of these steps.

Figure 1:
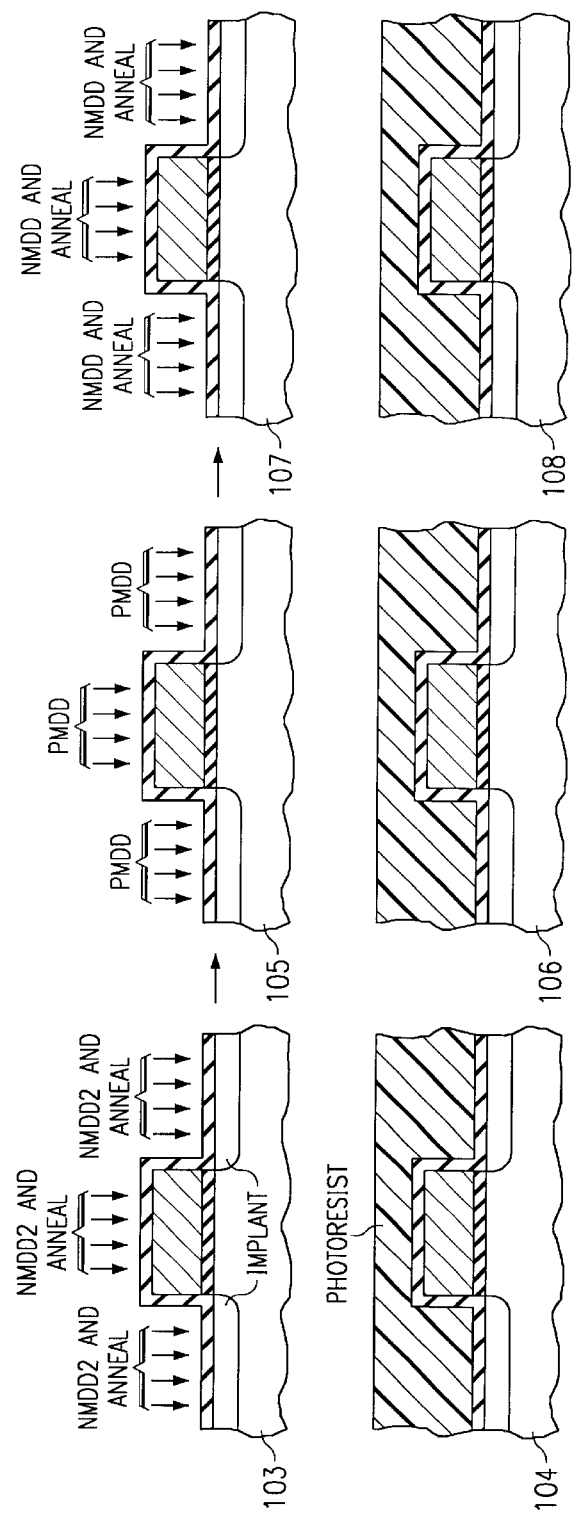
FIG. 1 illustrates conventional MDD extension processing.
Figure 1:
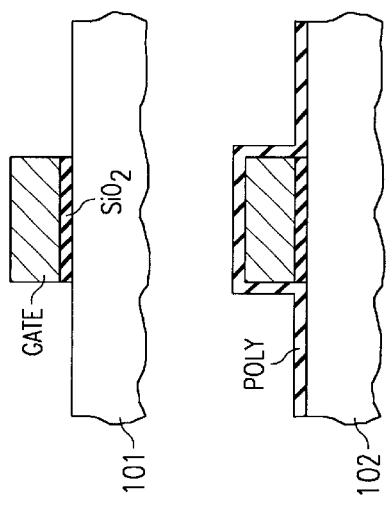

In the first step A is the step of forming the poly oxide over the silicon base and gate. This is represented by Stage 201 in FIG. 3. The next step B is covering the low voltage (LV) NMOS and all PMOS regions with photoresist. Step C is the high voltage implant (NMDD2+) of the NMOS regions to place the diffused implant under the poly oxide as illustrated by Stage 202 in FIG. 3. This is the same as the conventional process described in connection with FIG. 1.

The first change is in Step D of removing the poly oxide layer over the silicon base on either side of the gate and on the top of the gate by a dry reactive ion etching (RIE) etch, leaving only the side walls of all gate electrodes with the poly oxide as illustrated by stage 203. The next step E is covering the HV NMOS and PMOS areas as represented by stage 204 with photoresist as illustrated in FIG. 3. In this step the base, gate and side walls of the gate and all areas are patterned with the photoresist that we want to protect and leave open the area for the low voltage (LV) NMOS transistor implant.

In Step F the low voltage (LV) NMOS implant (NMDD) is performed directly on either side of the gate and on the gate. This is represented by stage 205 in FIG. 3. The RIE etch illustrated in stage 203 removed the poly oxide over the silicon base and poly gate top in the area of the NMOS core implant leaving the side walls with the single oxide layer. This removal of the poly oxide on the silicon base on either side of the gate before the NMDD implant gives a better dopant implant profile control and uses lower energy to do the implant resulting in less silicon damage. The oxide varies from lot to lot or wafer to wafer so there is loss due to the remaining oxide. When one implants through the oxide one may not implant through the same thickness all the time; but when the oxide is removed, you know you are starting from the same level.

The next step G is to deposit over the entire wafer a thin cap oxide (40–50 Angstroms, for example). This is represented by Stage 206. The capping of the NMOS transistor areas with cap ox after the NMOS implant prevents the arsenic dopant associated with the implant from out diffusing from the silicon.

A photoresist covers all NMOS transistor areas in step H but leaves exposed the PMOS transistors. This is represented by stage 207 in FIG. 3. The cap oxide covers the top of the poly gate and adds to the thickness of the side walls and top of silicon base on either side of the gate of the PMOS transistors. This is represented by Stage 208 in FIG. 3. The next step I performs a dry RIE etch to remove the cap oxide from the top of the poly gate and the top of the silicon base on either side of the gate and leaves a second side wall spacer provided by the oxide on each side of the gate. This is represented by stage 209 in FIG. 3. For the NMOS transistor we have only one side wall layer during the ion-implantation steps, but the PMOS transistor during the ion-implantation steps has a second side wall layer provided by the cap oxide as illustrated by stage 209.

The next step J is covering all but the low voltage PMOS transistors (covering HV MOS and all NMOS). The next step K is implanting the LV or core PMOS (PMDD+) implant. This is represented by stage 210 in FIG. 3. The implant is such that the PMOS implant is further from the gate than the NMOS implant. The PMOS implant is further from the gate due to the added second cap oxide layer on the side walls of the gate than the NMOS implants. The PMOS implant uses Boron for example that diffuses faster than the arsenic for example of the NMOS. This extra spacing prevents the PMOS from diffusing further under the gate than the NMOS diffusion because of the use of the extra spacing. This allows for greater freedom in tailoring the PMOS and NMOS implant conditions.

The next step L is patterning the photoresist over all NMOS transistor areas and the LV PMOS transistor device areas leaving the HV PMOS area exposed and then in Step M implanting the HV PMOS device areas in a similar manner as the LV PMOS implant. The next step N is annealing the NMOS and the PMOS devices.

Figure 4A:
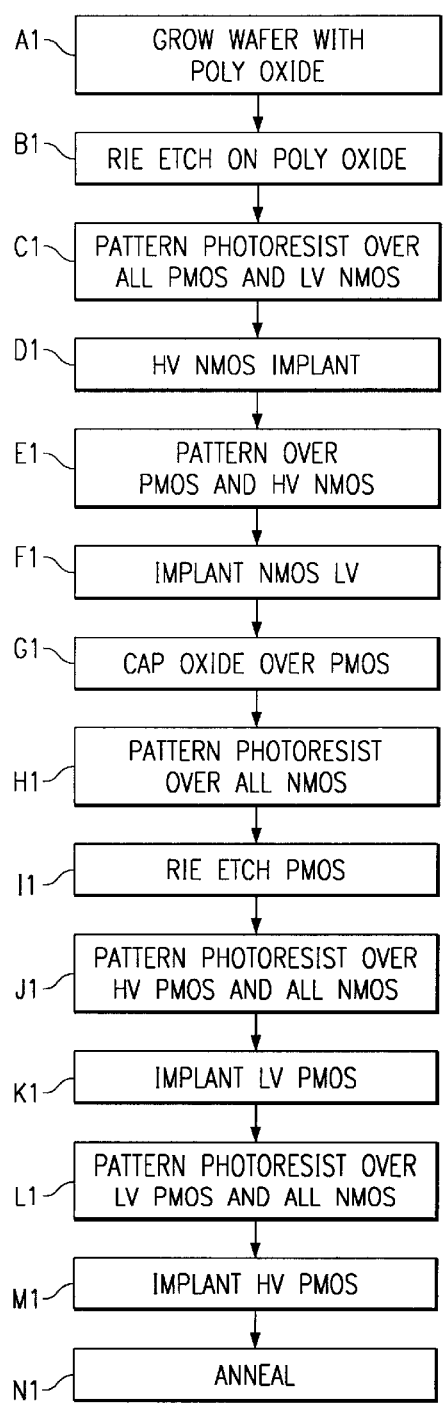
FIG. 4a illustrates a second alternative process according to a second embodiment of the present invention and FIG. 4b illustrates the stages in the second embodiment.
Figure 4B:
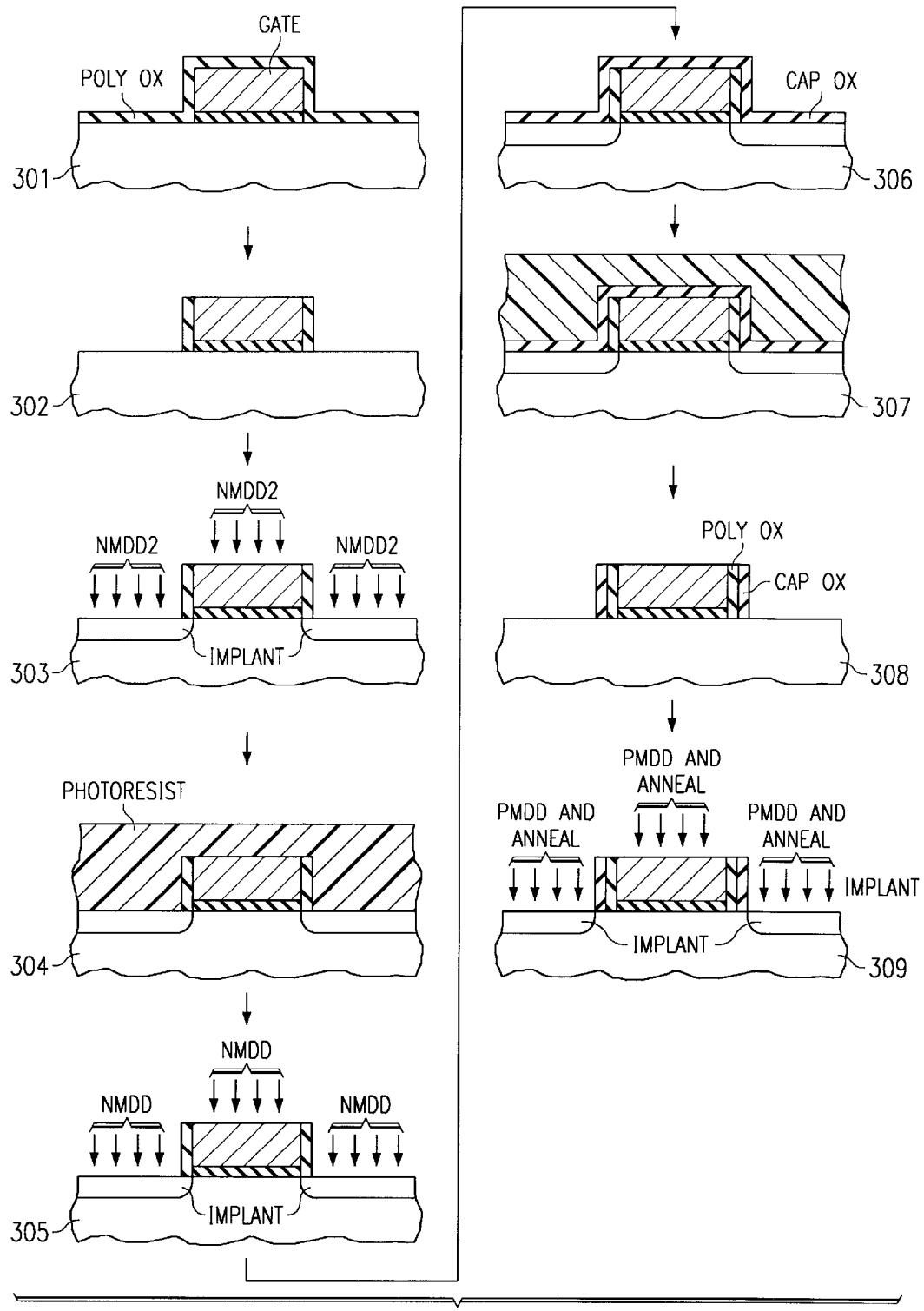

Referring to FIG. 4a, there is illustrated the steps according to a second embodiment of the present invention. FIG. 4b illustrates stages in the second embodiment of the present invention. In the first step A1 the wafer is covered with the 50 Angstroms of poly oxide as represented by stage 301 in FIG. 4b. The next step B1 is to perform the dry RIE etch to remove the poly oxide from all but the side walls of the gate as illustrated by stage 302. Before the HV implant in step D1 the PMOS transistor areas and the LV NMOS areas are covered with photoresist in step C1. Step D1 is the HV NMOS implant (NMDD2) and is represented by stage 303 in FIG. 4b. The HV NMOS implant is directly on the silicon base on either side of the extended gate and therefore gets the better controlled implanting without going through the oxide. The HV NMOS transistors and PMOS transistor areas are covered with a patterned photoresist in step E1 and the LV or core NMOS is implanted (Step F1) after the HV NMOS and illustrated by stage 305 in FIG. 4b.

A cap oxide of 40–50 Angstroms is placed over the wafer in step G1 as represented by stage 306 in FIG. 4b. This cap oxide prevents the dopant from out diffusing from the silicon and provides added side walls.

A photoresist covers all of the NMOS areas in step H1 as represented by stage 307. A dry RIE etch is then done on the PMOS areas in step I1 to remove the cap oxide on the top of the gate and on the top of the base but leaving the extra oxide on the gate side wall as illustrated by stage 308. The first side wall is provided by the poly oxide and the second side wall over the first is provided by the cap oxide.

The next step is J1 is patterning photoresist over all NMOS and HV PMOS. The next step K1 is implanting the LV PMOS areas to form the MDD implant for the LV PMOS devices. This is illustrated by stage 309 in FIG. 4B. When this PMDD+ region is formed the PMDD implant is further from the gate by the second sidewall than the NMOS implants so when annealed the NMOS and PMOS are the same distance under the gate. The next step L1 is covering the LV PMOS devices with the photoresist and step M1 is implanting the HV PMOS (PMDD2+) areas. The last step N1 is annealing the implants.

Figure 5A:
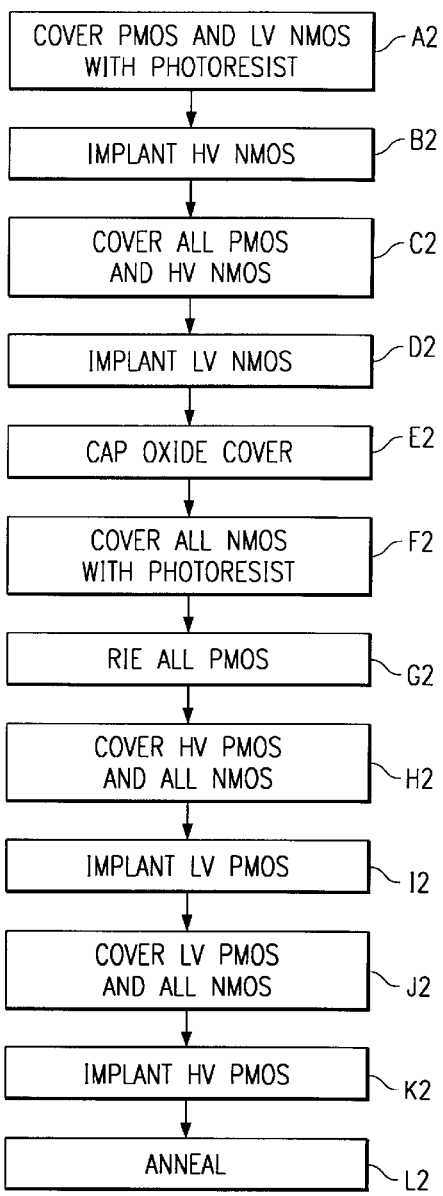
FIG. 5a illustrates a third alternative process according to a third embodiment of the present invention and FIG. 5b illustrates stages in the third embodiment.
Figure 5B:
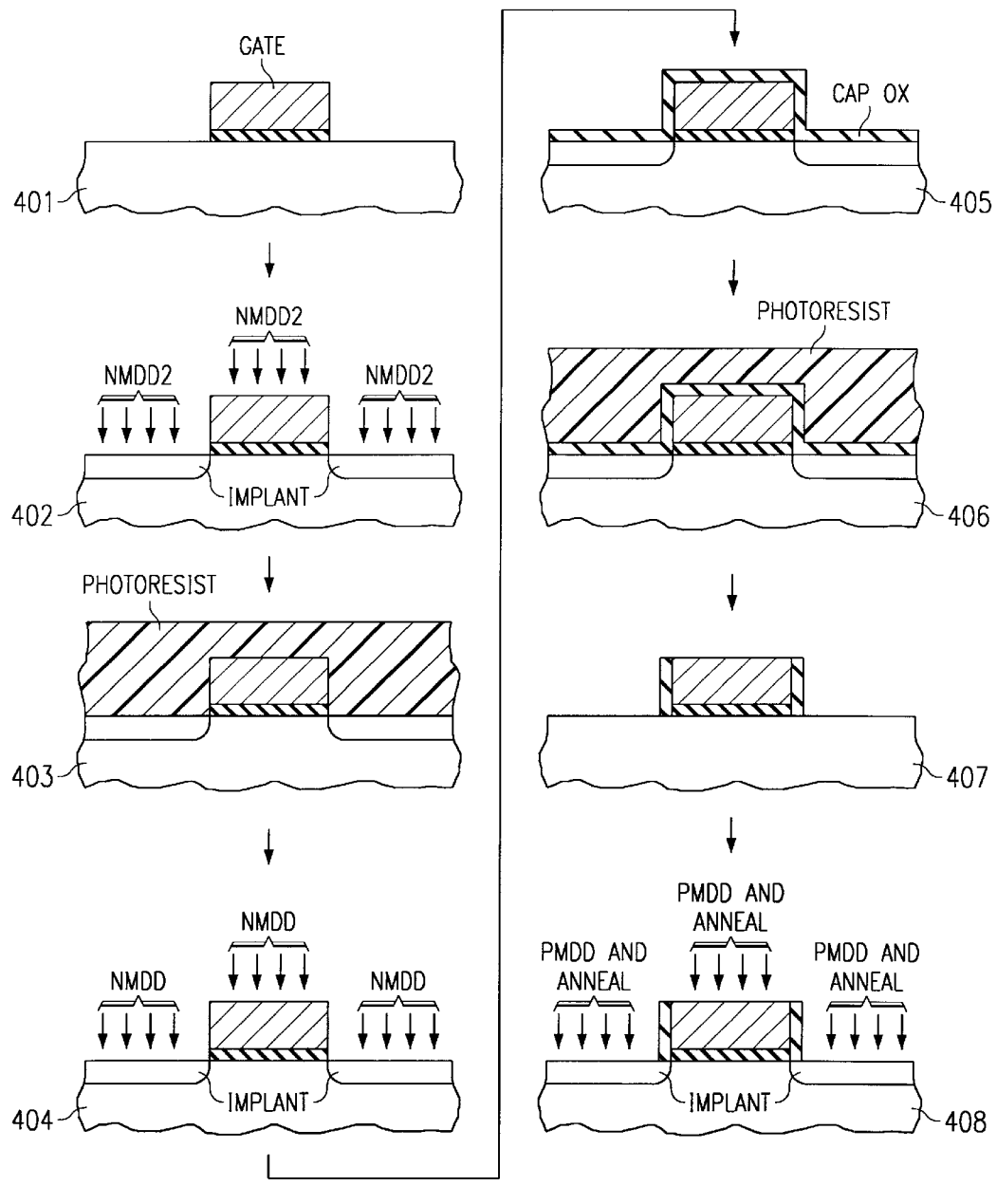

Referring to FIG. 5a, the third embodiment performs for HV or I/O NMOS implant (NMDD2+) without a poly oxide in Step B2 after covering with photoresist the PMOS and LV NMOS areas in step A2. This is illustrated by stage 402 in FIG. 5b. The benefit of the direct implant without the oxide is provided by this step. The next step C2 is to cover with photoresist the PMOS and the HV NMOS areas (stage 403) and then in step D2 to implant the LV NMOS areas (NMDD+) as represented by stage 404.

The next step E2 is to cover the wafer with a cap oxide as illustrated by stage 405. The cap oxide prevents the arsenic dopant from out diffusing from the silicon. The next step F2 is to cover the NMOS devices areas with photoresist as illustrated by stage 406. The cap oxide over the PMOS is etched by a dry RIE etch in step G2 to remove all but the side walls of the gate as illustrated by stage 407 so that when the PMDD implant to the core occurs it is spaced out a side wall thickness (one side wall more than the NMOS with no cap oxide layer) to allow for the faster diffusion of the PMOS implant during annealing. After the dry etch in step G2 the HV PMOS device areas are covered in Step H2 and the LV PMOS implant (PMDD+) occurs in step I2 as represented by stage 408. The LV PMOS areas are covered with the patterned photoresist in step J2 and the HV PMOS device areas are implanted (PMDD2+) in step K2. The implants are then annealed in step K2.

In the process steps after the RIE etch step I, steps J thru M in FIG. 2, a reduction in cost can be had by fewer masks by removing the mask step J, implanting at both LV PMOS and HV PMOS at step K, patterning photoresist over all but the HV PMOS in step L before finishing the HV PMOS implant in step M. The same improvement can be done for the second and third embodiments While specific embodiments of the invention has been shown and described, various modifications and alternative embodiments will occur to those skilled in the art. Accordingly, it is intended that the invention be limited only in terms of the appended claims.

What is claimed is:

1. A method of CMOS source/drain extension processing comprising the steps of:
   providing a wafer including gates for NMOS devices and PMOS devices;
   implanting NMOS device areas directly on base and gates without an oxide layer;
   covering the NMOS and PMOS device areas with a cap oxide covering the top surface of the wafer including the top of the gates and side walls of the gates;
   dry etching the PMOS device areas with a dry etch to remove all of the cap oxide but on the side walls of the gates; and
   implanting the PMOS device areas with the PMOS implant spaced by the cap oxide on the side walls of the gates.

2. The method of claim 1, including annealing after the step of implanting the PMOS device areas.

3. A The method of claim 1, including the step of implanting HV NMOS device areas before implanting LV NMOS device areas.

4. The method of claim 1, wherein said processing is source/drain extension processing and said implanting is forming MDD or HDD implants.

5. A method of CMOS source/drain extension processing comprising the steps of:

a. providing a semiconductor wafer including NMOS devices and PMOS devices, the NMOS and PMOS devices having gate, source, and drain regions, the gate regions having sidewalls;
b. implanting dopant-ions into the gate, source and drain regions of the NMOS devices without an oxide layer;
c. providing a sidewall spacer on the sidewalls of the PMOS devices and a dopant-out-diffusion preventing element on the gates of the NMOS devices;
d. implanting dopant-ions into the gate, source and drain regions of the PMOS devices; and
e. annealing the wafer at an elevated temperature for creating a medium doped drain extension structure in the NMOS and PMOS devices.

6. A method of CMOS source/drain processing comprising the steps of:
a. providing a semiconductor wafer including NMOS devices and PMOS devices, the NMOS and PMOS devices having gate, source, and drain regions, the gate regions having sidewalls;
b. implanting dopant-ions into the gate, source and drain regions of the NMOS devices without an oxide layer;
c. depositing a dielectric material layer over the wafer subsequent to the implanting step b;
d. removing the dielectric material from a portion of the wafer, uncovering the gate, source and drain regions of the PMOS devices;
e. implanting dopant-ions into the gate, source and drain regions of the PMOS devices; and
f. annealing the wafer at an elevated temperature.

7. The method of CMOS source/drain processing in claim 6, in which the source and drain regions of the NMOS devices are covered with a dielectric material layer at the implanting step b.

8. The method of CMOS source/drain processing in claim 6, in which the gate region of the NMOS devices are covered with a dielectric material layer at the implanting step e.

9. The method of CMOS source/drain processing in claim 6, in which the removing step d is by an RIE technique.

10. The method of CMOS source/drain processing in claim 6, in which the PMOS devices are covered with photoresist material in the implanting step b and the NMOS devices are covered with photoresist material in the implanting step e.

* * * * *